United States Patent
Garnham et al.

[11] Patent Number: 6,093,955
[45] Date of Patent: Jul. 25, 2000

[54] POWER SEMICONDUCTOR DEVICE

[76] Inventors: David A. Garnham, 34 Townsend Road, Sharnbrook, Bedford MK44 1HY; Koenraad T. F. Rutgers, 22 Marriotts Close, Felmersham, Bedford MK43 7HD, both of United Kingdom

[21] Appl. No.: 08/512,377

[22] Filed: Aug. 7, 1995

[30] Foreign Application Priority Data

Aug. 5, 1994 [GB] United Kingdom .................... 9415874

[51] Int. Cl.$^7$ ................................................. H01L 29/167
[52] U.S. Cl. .......................................... 257/610; 257/590
[58] Field of Search .................................... 257/610, 611, 257/156, 577, 590

[56] References Cited

U.S. PATENT DOCUMENTS

| 4,259,683 | 3/1981 | Adler et al. | 257/156 |
| 4,754,315 | 6/1988 | Fisher et al. | 257/617 |
| 5,343,068 | 8/1994 | Frisina et al. | 257/590 |

FOREIGN PATENT DOCUMENTS

| 341 000 A2 | 11/1989 | European Pat. Off. . |
| 247 823 A2 | 5/1975 | France . |
| 050 055 A2 | 12/1980 | United Kingdom . |
| 171 555 A2 | 8/1986 | United Kingdom . |

OTHER PUBLICATIONS

Patent Abstracts of Japan, vol. 8 No. 185, (E–262) [1622], Aug. 24, 1984, Thyristor, Nippon Denki K.K.

*Primary Examiner*—Mark V. Prenty
*Attorney, Agent, or Firm*—Young & Basile, P.C.

[57] ABSTRACT

A semiconductor device having two or more p-n junctions, being in particular a bipolar transistor or a thyristor. The device has an gold ion implant in a region of the device between two of or the two p-n junctions, which region is the base in the case of a bipolar transistor, located away from the current carrying active region of the device. The device has a low resistance and may be turned off rapidly because the implanted gold provides recombination centers which act as a sink for carriers drawing them from the active region.

10 Claims, 2 Drawing Sheets

POWER SEMICONDUCTOR DEVICE

The present invention relates to semiconductor devices, especially to power semiconductor devices, for example, bipolar transistors.

In many applications of power bipolar transistors it is desirable for such a transistor to have both a short switching time and a small voltage between the emitter and collector of a transistor when the saturation current is flowing through it ($V_{ce,sat}$); the latter ensures that power dissipated in the transistor is kept to a minimum. Those two objectives have not previously been achieved in the same transistor.

At present there are two types of power transistor using planar technology in which transistors are formed at the surface of a semiconductor substrate. The transistors are used in such applications as driving fluorescent lighting tubes at high frequencies.

The first type of transistor is optimised to have a short switching time. That is achieved by damaging the surface layer of the substrate by grinding with alumina grit before the transistors are formed in that layer. That process forms a large number of recombination centres with the result that the lifetime of the carriers is greatly reduced. That in turn has the result that the transistors may be rapidly switched off. Unfortunately the damage makes the semiconductor material more resistive and therefore increases $V_{ce,sat}$ of the transistor. The damage also reduces the current gain ($h_{fe}$) of the transistor.

The second type of transistor is optimised to have a small $V_{ce,sat}$. To achieve that the substrate is etched before the transistors are formed to expose a fresh damage-free surface. The semiconductor material making up the transistors therefore has a low resistance resulting in transistors of a low $V_{ce,sat}$. The corresponding long lifetime of carriers in the transistors means that the transistors cannot, however, be rapidly switched off.

It is an object of the present invention to provide a transistor that has a small $V_{ce,sat}$ and a short switching time.

The present invention provides, in a first aspect, the use, in a semiconductor device comprising two or more p-n junctions in series and including a region of a first conductivity type that is bordered by two p-n junctions, of recombination centres that are located away from the part of the region of a first conductivity type through which the majority of the current conducted between the p-n junctions bordering the region of the first conductivity type flows, to draw carriers from that part to increase the rapidity with which the semiconductor device may be turned off.

The drawing of the carriers from the active region through which the current mainly flows is made use of in the following aspects of the invention.

The present invention provides, in a second aspect, a semiconductor device comprising two or more p-n junctions in series and including a region of a first conductivity type that is bordered by two of or the two p-n junctions, a region of added recombination centres that are located within the region of the first conductivity type away from that part of that region through which the majority of the current conducted between the p-n junctions bordering that region flows, wherein that part of that region is substantially free from added recombination centres.

The present invention provides, in a third aspect, a semiconductor device comprising two or more p-n junctions in series and including a region of a first conductivity type that is bordered by two p-n junctions, a region of added recombination centres that are located away from the part of that region through which the main part of the current conducted between the p-n junctions bordering that region flows, wherein material of the semiconductor device is silicon, the recombination centres are gold and the concentration of the recombination centres is less than $2 \times 10^{13}$ cm$^{-2}$.

In the first, second and third aspects, the semiconductor device may be a bipolar transistor, in which case the region of the first conductivity type is the base region of the transistor and is bordered by emitter and collector regions.

In those aspects the semiconductor device may be a thyristor.

In those aspects of the invention, the region of extrinsic recombination centres may be located entirely within the region of the first conductivity type or the base region as the case may be.

The present invention provides, in a fourth aspect, a bipolar transistor comprising emitter, base and collector regions and having a region of added recombination centres located in the base region away from the part of the base region through which the majority of the current conducted between the emitter and collector regions flows.

The present invention provides in a fifth aspect a bipolar transistor having an ion implant in a selected region wherein the transistor, as compared to a transistor identical to the claimed transistor but without the ion implant, has a minimum time in which the transistor may be turned off reduced by 5% or more and a $V_{ce,sat}$ increased by less than 10%.

In the fourth and fifth aspects of the invention the region of added recombination centres may be located entirely within the base region.

The material of the semiconductor device or the transistor may be silicon.

The added recombination centres may be platinum or, preferably, gold.

The concentration of the gold is advantageously less than $2 \times 10^{13}$ atoms cm$^{-2}$ and may be between $1 \times 10^{12}$ and $2 \times 10^{13}$ atoms cm$^{-2}$ and is preferably about $1 \times 10^{13}$ atoms cm$^{-2}$.

The region of added recombination centres may be divided into a plurality of separate sub-regions.

The region of added recombination centres or a sub-region thereof may be located under a bond pad.

The region of added recombination centres may be made by ion implantation, which may be effected through a window in a layer of material that in the finished device insulates semiconductor material from metallisation; preferably the insulating material and any other windows in that material are protected during the implantation by a mask.

The present invention provides, in a sixth aspect, a method of making a semiconductor device comprising two or more p-n junctions in series and including a region of a first conductivity type that is bordered by two p-n junctions, the method comprising ion implanting, with a chemical species that gives rise to recombination centres, part of the first region through which, in the use of the device, the majority of the current conducted through the p-n junctions bordering the first region does not flow.

A transistor according to the invention may be integrated on the same substrate as a diode connected between the emitter and collector of the transistor to conduct current in the opposite sense to the current carried by the transistor in the active mode. That diode may also have added recombination centres.

The region of recombination centres results in the time in which the semiconductor device, a transistor for example, may be switched off being short; as the base current is reduced as the transistor is switched off, the carriers stored in the base are drawn to the implanted region where they recombine. Since the active region has not been implanted, the resistance of the device, and therefore, in the case of a bipolar transistor, $V_{ce,sat}$ and $h_{fe}$, are not affected.

There will now be described, by way of example only, a power bipolar transistor according to the present invention with reference to the accompanying drawings, of which:

Figure 1:
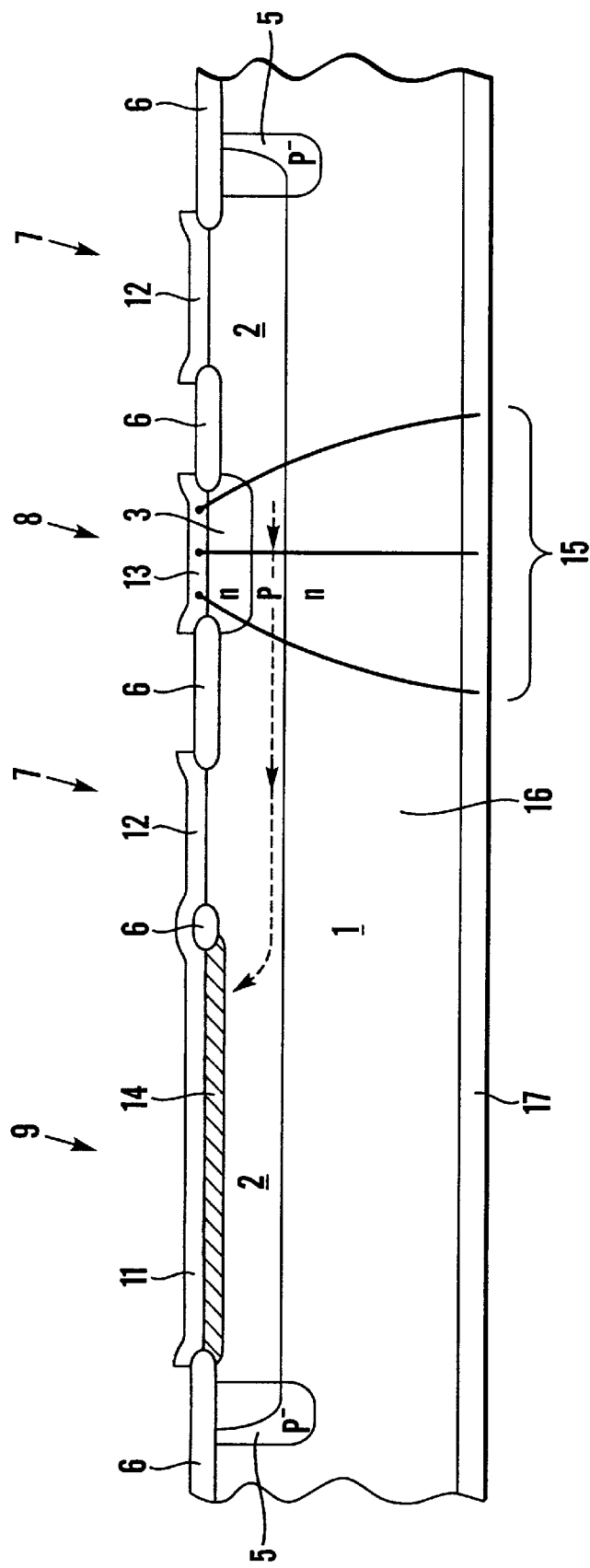
FIG. 1 is a cross section of a bipolar transistor after the metallisation stage has been completed.

FIG. 1 is a cross section of a bipolar transistor formed at the surface of an n-type silicon substrate 1. The base region of the transistor is provided by a p-type region 2 formed at the surface of the substrate 1. The emitter region of the transistor is provided by an n-type region 3 formed at the surface of the substrate within the base region 2. The collector of the transistor is provided by the remainder of the substrate 1. The base region is ringed by a deeper, less heavily doped p-type region 5 which increases the breakdown voltage of the transistor.

A layer of oxide 6 grown by oxidising the silicon of the substrate overlies the substrate. The oxide 6 has windows 7, 8 and 9. An aluminium metal layer overlies the oxide layer and makes contact to the base 2 and emitter 3 regions through the windows in the oxide. The metal layer is patterned into two separate regions. The first provides a base bond pad 11 and a base contact 12, and the second provides an emitter contact 13 and an emitter bond pad (FIG. 2).

The metal layer is formed by the conventional process of depositing a layer of aluminium which is sintered to from a eutectic with the silicon for ohmic contact and mechanical strength, followed by etching to pattern it.

A collector contact 17 is formed on the rear side of the substrate 1.

Figure 2:
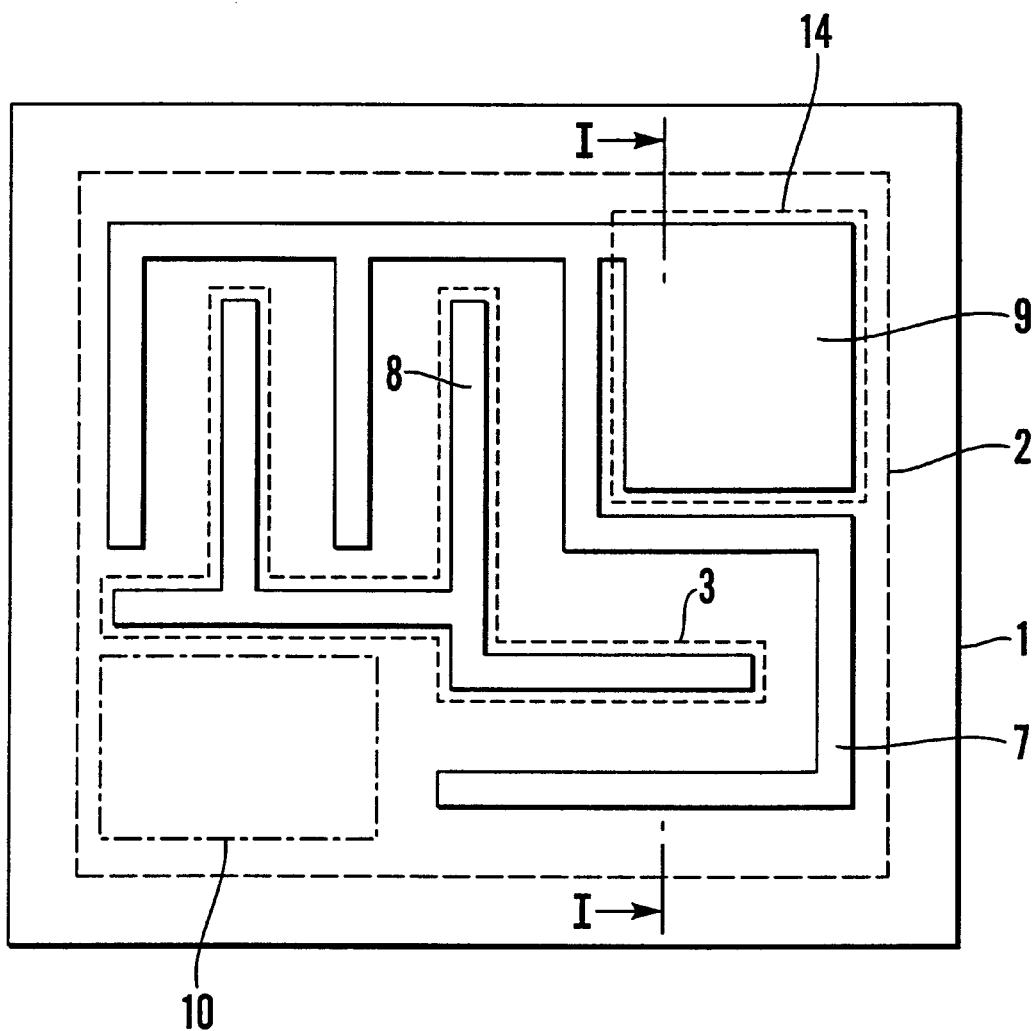
FIG. 2 shows the transistor of FIG. 1 in plan at the stage of production just before the metallisation stage.

FIG. 2 shows the transistor of FIG. 1 in plan at the stage of production before the metal layer has been added. Only a single transistor is shown although usually many transistors are made on the substrate which is divided up when the transistors are completed. The location of the cross section of FIG. 1 is marked on FIG. 2 at I—I.

Referring to FIGS. 1 and 2, the base region 2 is a large rectangular region within which the emitter region 3 is formed in a fingered shape. The fingered shape is used to obtain the large current capability required of a power transistor. The window 8 has the same shape so that electrical contact may be made to all parts of the emitter region 3 with the emitter contact 12. The window 7 through which connection is made to the base region 2, with the base contact 12, is also fingered and is interdigitated with the window 8.

The methods by which the structures described above may be made are well known.

The window 9 in the oxide layer 6 is large and has the metal base bond pad 11 deposited over it. The base bond pad is used to connect the base region 2 to the base terminal of the packaged transistor. A second bond pad, via which connection is made between the emitter region 3 and the emitter terminal of the packaged transistor, is formed on top of the oxide so that this bond pad is insulated from the base region 2. The location of where the second bond pad is formed is marked in FIG. 2 with a box 10 outlined with a dash-dot line.

At the stage of production shown in FIG. 2, a photoresist mask is formed over the transistor with a window leaving the window 9 in the oxide exposed. Gold is implanted through the windows in the photoresist and the oxide into the base region 2 of the transistor. An accelerating voltage of 80 keV for the gold ions is used. The photoresist is removed and the transistor is annealed at 930° C. for 5 minutes in an oxidising atmosphere to repair the damage caused by the implantation; the oxide that grows over the windows in the oxide layer 6 during the anneal step is removed by etching. The result of the implantation is that part of the base region has gold recombination centres having a concentration of $1 \times 10^{13}$ $cm^{-2}$. That concentration may be measured by integrating the concentration profile of gold atoms produced a secondary ion mass spectrometer.

FIG. 1 shows the region 14 under the base bond pad 11 that is implanted with gold and has a high carrier recombination rate. The effect of the gold implanted region 14 on the operation of the transistor is thought to be as follows.

When the transistor is conducting current between the emitter and the collector, the majority of that current flows through base region 2 through the part of the base region below the emitter region 3. That part of the base region is known as the "active" part. Since the gold implant is not on the current path through the emitter region 3, the base region 2 and the collector region 1 the implant does not cause any additional resistance to current flow along that path and so $V_{ce,sat}$ is not increased. The current flow is represented in FIG. 1 by arrows 15. The direction of those arrows indicates the direction of conventional current.

While a bipolar transistor is conducting there is a large charge of minority carriers (in this case electrons) stored in the active part of the base region. These have to removed if the transistor is to be turned off so that only leakage current passes between the emitter and the collector. The gold implanted region 14 acts as a sink for minority carriers in the base. That is because the carrier lifetime in that region is short because the added gold atoms provide extra recombination centres which means that the concentration of minority carriers in that region is low. There is, therefore, a concentration gradient between the active part of the base region and the gold implanted region 14, which gradient causes a diffusion current drawing minority carriers from the active part of the base region. That diffusion current is represented by a dashed arrow 16 in FIG. 1. While the transistor is being turned off by reducing the voltage between the base and the emitter, the diffusion current caused by the gold implant aids in the reduction of the concentration of minority carriers in the active part of the base region and so reduces the time it takes for the transistor to be turned off.

A series of transistors was made with concentrations of the implanted gold atoms of $1 \times 10^{12}$, $5 \times 10^{12}$, $1 \times 10^{13}$ and $2 \times 10^{13}$ $cm^{-2}$ respectively. The first of those was found to have a switching time of barely less than the same transistor made with no gold implant. It was found that as the concentration was increased the time for the device to be switched off was reduced. At $2 \times 10^{13}$ $cm^{-2}$ an increase in $V_{ce,sat}$, relative to a similar device without the gold implant, was noted but not to an unacceptable value.

It is not necessary for the region of recombination centres to be located underneath the bond pad, but that location is convenient as it does not require that any extra space be used for the region.

In large devices it may be desirable to provide more than one region of recombination centres distributed across the device to ensure that all parts of the device that carry the major part of the current are sufficiently close to the recombination centres to provide a carrier concentration gradient and hence the diffusion current generated sufficient to draw the carriers from the active region and turn the device off as quickly as is desired.

An example of a method by which a bipolar transistor as illustrated in FIGS. 1 and 2 may be made is as follows. A 100 mm diameter of n-type 60–80 Ω cm float-zone silicon having a thickness of 635 μm (25 mils) is phosphorus doped at 1200° C. for 4 hours using POCl$_3$ as the source of phosphorus. The wafer is then annealed at 1325° C. for 156 hours. The resulting phosphorus doped regions extend 240 μm (9.5 mils) from both sides of the wafer. The upper phosphorus doped region is removed by grinding to leave a wafer 355 μm (14 mils) thick.

The top surface of the wafer is then polished and the base and emitter regions of a plurality of transistors are formed at that surface. The phosphorus doping in the lower two thirds of the wafer serves to reduce the collector resistance of the finished transistors.

The region 5 for increasing the breakdown voltage and the base region 2 are formed using two boron ion-implantation stages.

For the region 5, an oxide mask layer of 0.8 μm thickness is grown in an oxidising atmosphere and is patterned to expose a window. Through that window $7.0 \times 10^{12}$ ions cm$^{-2}$ are implanted and the wafer is annealed for 60 hours at 1300° C. The boron penetrates the wafer to a depth of 4.4 μm. The anneal is performed in an oxidising atmosphere which results in more oxide forming in the window.

For the base region 2, a new window in the oxide layer is opened and $5.2 \times 10^{14}$ ions cm$^{-2}$ are implanted. The wafer is then annealed for 2.2 hours at 1300° C. in an oxidising atmosphere.

A further window is then opened in the oxide layer and the emitter region 3 is phosphorus doped through that window by exposing the wafer to POCl$_3$ for 110 minutes at 110° C. The phosphorus penetrates to a depth of 0.62 μm.

The next stage is to ion-implant the gold region 14. Oxide covering the window 9 is first removed and then a layer of photoresist is spun onto the wafer and is patterned to expose a window extending over most of the window 9 to just inside its perimeter. $1 \times 10^{13}$ ions cm$^{-2}$ of gold are then ion-implanted through the window in the photoresist and through the window 9 in the oxide into the part of base region that will be under the base bond pad. An accelerating voltage of 80 keV is used. The photoresist is then removed and the wafer is annealed at 930° C. for 5 minutes in an oxidising atmosphere.

The oxide covering each of the windows 7, 8 and 9 is then removed by etching and the aluminium layer is then deposited on the top surface of the wafer and patterned. An aluminium layer is also deposited on the bottom surface of the wafer to act as the collector contact 17.

The wafer is divided into chips having a single transistor on each.

As mentioned above an antiparallel diode connected between the emitter and the collector may be integrated on each chip. The diode is preferably formed using another boron ion-implantation stage between the two described above. A window in the oxide layer is opened and $5.2 \times 10^{14}$ ions cm$^{-2}$ are implanted into the n-type substrate to form the anode of the diode. The wafer is then annealed for 2.2 hours at 1300° C. in an oxidising atmosphere. The anode penetrates the wafer to a depth of 0.64 μm.

The anode region of the diode may receive a same gold implant, which may be achieved by opening windows in the oxide and the photoresist to expose the anode region, in addition to the part of the base region that will be under the base bond pad, and implanting into both regions at the same time.

When an antiparallel diode is integrated with the transistor, a separate emitter bond pad need not be provided; an aluminium connection to the anode of the diode may serve as a bond pad for connecting to both the anode and the emitter.

We claim:

1. A bipolar transistor having a base, a collector, an emitter, and a carrier recombination center for removing minority carriers from an active region of the base, wherein the carrier recombination center has a location outside of a current path between the emitter and the collector of the transistor, wherein the location of the carrier recombination center is under a base contact region of the bipolar transistor, whereby $v_{ce,sat}$ is not increased.

2. The bipolar transistor of claim 1 wherein the carrier recombination center comprises a gold implanted region.

3. A bipolar transistor comprising:

a base region, a collector region and an emitter region, the base region having an active portion through which the majority of current that flows between the collector and the emitter flows;

a carrier recombination center for sinking minority carriers from the active portion of the base region, the carrier recombination center being located outside a current path through the emitter region under a base contact region of the transistor, whereby $V_{ce,sat}$ is not increased.

4. The bipolar transistor of claim 3 wherein the bipolar transistor and the recombination center form a single semiconductor device.

5. The bipolar transistor of claim 3 wherein the location of the recombination center does not effect the $h_{fe}$ of the transistor.

6. The bipolar transistor of claim 3 wherein the carrier recombination center comprises a platinum implanted region.

7. A bipolar transistor comprising:

a base region, a collector region and an emitter region, the base region having an active portion through which the majority of current that flows between the collector and the emitter flows;

a carrier recombination center for sinking minority carriers from the active portion of the base region, the carrier combination center being located outside a current path through the emitter region, whereby $V_{ce,sat}$ is not increased, wherein the carrier recombination center comprises a gold implanted region and the carrier recombination center is located under a base contact region of the transistor.

8. The bipolar transistor of claim 7 wherein the bipolar transistor and the recombination center form a single semiconductor device.

9. The bipolar transistor of claim 7 wherein the concentration of gold in the recombination center is less than substantially $2 \times 10^{13}$ cm$^{-2}$.

10. A bipolar transistor comprising:

a base region, a collector region and an emitter region, the base region having an active portion through which the majority of current that flows between the collector and the emitter flows;

a carrier recombination center for sinking minority carriers from the active portion of the base region, the carrier recombination center being located outside a current path through the emitter region, whereby $V_{ce,sat}$ is not increased, wherein the carrier recombination center comprises a gold implanted region and the bipolar transistor and the carrier recombination center form a single semiconductor device.

\* \* \* \* \*